United States Patent

Evans et al.

Patent Number: 5,683,758
Date of Patent: Nov. 4, 1997

[54] METHOD OF FORMING VIAS

[75] Inventors: Michael D. Evans, Wilmington; Tae Yong Kim, Boxford, both of Mass.; Henry Miles O'Bryan, Jr., Plainfield, N.J.

[73] Assignee: Lucent Technologies Inc., Murray Hill, N.J.

[21] Appl. No.: 573,923

[22] Filed: Dec. 18, 1995

[51] Int. Cl.⁶ .............................. B05D 5/12; B05D 3/02; C23C 14/00; B23K 26/00

[52] U.S. Cl. .................. 427/555; 427/97; 427/99; 427/124; 427/125; 427/376.2; 427/531; 204/192.17; 216/17; 216/65; 219/121.71

[58] Field of Search ....................... 427/555, 526, 427/531, 97, 99, 123, 124, 125, 376.2; 204/192.17, 192.15; 216/17, 65, 94; 156/643.1, 644.1; 219/121.66, 121.69, 121.71, 121.72

[56] References Cited

U.S. PATENT DOCUMENTS

| | | | |
|---|---|---|---|
| 4,016,050 | 4/1977 | Lesh et al. | 204/15 |
| 4,020,206 | 4/1977 | Beil | 428/137 |
| 4,109,297 | 8/1978 | Lesh et al. | 361/402 |
| 4,175,060 | 11/1979 | Fleming, Jr. et al. | 252/518 |
| 4,544,577 | 10/1985 | May | 427/97 |
| 4,563,661 | 1/1986 | O'Bryan, Jr. et al. | 333/202 |
| 4,574,094 | 3/1986 | DeLuca | 427/96 |
| 4,604,299 | 8/1986 | DeLuca et al. | 427/98 |
| 4,630,171 | 12/1986 | Dubuisson et al. | 361/321 |
| 4,663,826 | 5/1987 | Baeuerle | 29/571 |
| 4,715,117 | 12/1987 | Enomoto | 29/851 |
| 4,728,560 | 3/1988 | Sirinyan et al. | 428/195 |
| 4,733,049 | 3/1988 | Lemelson | 219/121 |
| 4,792,646 | 12/1988 | Enomoto | 174/68.5 |
| 5,011,725 | 4/1991 | Foster | 428/137 |
| 5,277,723 | 1/1994 | Kodama et al. | 156/89 |
| 5,293,025 | 3/1994 | Wang | 219/121 |
| 5,294,567 | 3/1994 | Dorfman et al. | 437/187 |

Primary Examiner—Marianne Padgett
Attorney, Agent, or Firm—John T. Rehberg

[57] ABSTRACT

A method of forming a via hole in a substrate includes forming an opening in a substrate thereby forming a slag and then heating the substrate to recombine the slag with the substrate.

8 Claims, 1 Drawing Sheet

METHOD OF FORMING VIAS

TECHNICAL FIELD

This invention relates to methods for forming openings or vias in substrates.

BACKGROUND OF THE INVENTION

Many modern electronic devices utilize substrates upon which a variety of integrated circuits or discrete components are mounted. It is often necessary to form holes in these substrates and subsequently metalize both the interior of the hole and a portion of the upper and lower surface of the substrate.

One popular substrate is alumina which is used as a support for a variety of thin and thick film circuits. Recently substrates with higher dielectric constant have been sought for use in microwave integrated circuits. These substrates normally called "titanates" have lower strength and lower thermal conductivity than alumina. Those who have attempted to form holes in titanates and subsequently metalize these holes have often found that the metal does not adhere properly or that subsequent circuit performance is degraded. Further, others have found that the titanate substrate tends to shatter, or crack during or immediately following efforts to perforate the substrate with a focused thermal beam, such adduced by a carbon dioxide laser. Other methods of placing the vias in the substrate are impeded by poor rate (ultrasonic perforation techniques) or poor placement accuracy (punching before firing the ceramic). Concerning punched tape methods, the shrinkage of the tape is significant for many types of ceramic that are formed by firing of a "slip" or soft ceramic-filled plastic tape. This shrinkage can amount to >10% of the length of a plate. The punched substrate process is rapid but the placement accuracy of the holes is a problem making it unsuitable for the precision placements required for typical high frequency (microwave and RF) designs.

Thus, there is a need for improved methods of forming such holes in substrates.

SUMMARY OF THE INVENTION

The present invention is a method of forming a via hole in a substrate comprising:

forming an opening in the substrate by exposing the substrate to an energy beam, thereby forming a slag;

heating the substrate, thereby causing the slag to recombine with the substrate;

depositing a material upon the substrate and within the opening.

DETAILED DESCRIPTION

There are three major composition groups of microwave titanates—barium titanates, zirconium-tin titanates and rare earth titanates. The barium and zirconium-tin groups have dielectric constant between 34 and 40 while the rare earth group (barium titanate substituted with neodymium or samarium) have dielectric constant near 80. For devices operating near 2 GHz barium titanate is the preferred substrate because of its simpler chemistry and less expensive constituents. Barium titanate substrates may be formed by a variety of processes. Typically, the completed substrate (which is often termed "barium titanate") contains a substantial amount of $Ba_2Ti_9O_{20}$, (termed "barium nano-titanate"), together with minor amounts of $TiO_2$ or $BaTi_4O_9$ and additives to improve sintering and/or to modify the temperature coefficient of capacitance. Substrates presently available such as those manufactured by Coors Ceramics Co., and Trans-Tech (a subsidiary of Alpha Industries) are not pure chemical compounds, but contain a mixture of the above-mentioned compounds. Typically, commercially available barium nano-titanate dielectric substrates have a dielectric constant between 34 and 40. A variety of methods may be utilized to prepare such substrates. The dielectric constant of barium titanate with substituted neodymium or samarium may have a dielectric constant between 81 and 88.

Lasers may be utilized to drill or cut holes through barium titanate substrates. However, it has been found, that subsequentially-applied metallization frequently does not adhere properly.

Figure 1:
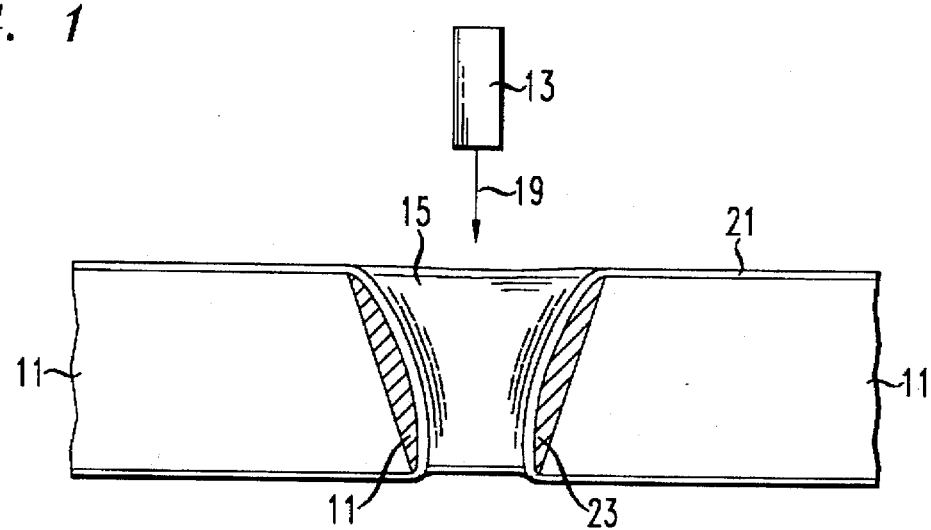
FIGS. 1 and 2 are cross-sectional views useful in understanding an illustrative embodiment of the present invention.
Figure 3:
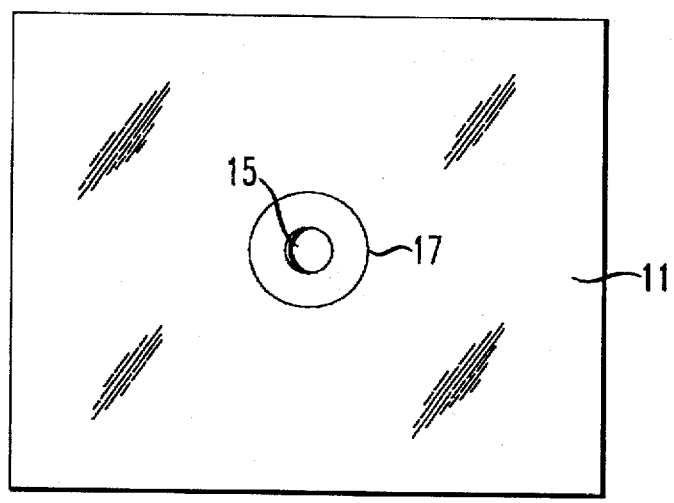
FIG. 3 is a plan view of an illustrative embodiment of the present invention.

In FIG. 1, reference numeral 11 denotes a barium titanate substrate. Reference numeral 13 denotes a laser which directs radiant energy towards substrate 11. Typically, laser 13 is a $CO_2$ laser. Substrate 11 is placed generally perpendicular to laser 13. Applicants have discovered that if proper focus and power calibration are not performed for laser 13, that a hole 15 is formed, as shown in FIG. 3. However, as illustrated in FIG. 3, a circular halo 17 may be observed to surround hole 15. The presence of halo 17 indicates formation of microcracks in the region of hole 15. This microcracking is generally visible under 100 times magnification by using suitable dyes or by electron microscopy. Microcracking contributes to substrate fracture, poor metal adhesion and poor subsequent circuit performance. Microcracking may be eliminated by utilizing proper laser drilling procedures, outlined below.

The pulse period of the laser should be adjusted so that it is long enough to allow heat dissipation between laser pulses. On barium titanate substrates, having a thickness of 20 to 60 mils, a minimum setting 10 ms has proven effective (particularly on preferred thickness of 27 mils).

A short laser duty cycle has been found to provide a desirable pulse shape. The most desired pulse has a fast rise time, a well defined sharp peak, and fast decay, thereby producing a narrow pulse width. Applicants use of 4 to 6% duty cycle provides a sharp pulse with 0.15 ms rise time and 0.2 to 0.3 ms pulse width.

The power of laser 13 should be lower than the laser power typically used to drill alumina substrates. An average desirable power range for a barium titanate substrate is between 5 watts and 20 watts. By contrast, approximately 40 watts is utilized to drill alumina substrates. If the power setting is too low to maintain steady laser electronics, the power setting may be adjusted higher by controlling the gas mixture. Lowering the carbon dioxide fraction allows a higher power setting.

In addition, it has been observed that spinning of laser beam 19 reduces thermal shock as well as improves hole shape. However, spinning of the beam should be slow enough to allow heat dissipation. Applicants have found that a desirable spinning speed range for barium titanate substrates is between 30 and 100 rpm. By contrast, spinning speeds of approximately 500 rpm are utilized for alumina substrates. When spinning of the laser beam is not possible, rotation of the substrate provides the same effect.

Focus of laser beam 19 upon substrate 11 is critical. Severe microcracking results when laser beam 19 is poorly focused. Desirably, the focus plane should be at the top surface 21 of substrate 11. However, for substrates 20–60 mils thick, applicants have found that if the focus plane is within substrate 11, acceptable results are also achievable. For barium titanate having thicknesses between 20 and 60 mils the focal plane may be either at the surface 21 of substrate 11 or located on a plane within substrate 11.

The laser beam should have a well defined single peak. Low power side peaks surrounding the periphery of the major peak cause severe microcracks. To eliminate such side peaks, a filter has been found effective.

It has been observed that after the laser drilling, a glassy slag 23 forms on the interior of hole 15. Although, proper focus of beam 19 can reduce the amount of slag formation, some slag is usually formed. The presence of slag 23 makes subsequent metallization difficult. Slag 23 does not adhere well to substrate 11. If hole 15 were metalized (without applicant's subsequent heat treatment which is discussed below) the metal would not stick well to slag 23, and slag 23 would not stick well to substrate 11. Applicants have concluded that a subsequent thermal annealing step causes the chemical components of slag 23 to recombine with the other chemical components of substrate 11.

The chemical composition of the slag has been analyzed with energy dispersive xrays (EDS), Auger spectroscopy, and xray photoelectron spectroscopy. The composition of the black, dark, glassy material 23 which is formed as a result of laser impingement, is identical in composition to the pale ivory colored basis material 11 (within the detection limits of the techniques). There is no long range order to the dark material which has the appearance of a liquid which has frozen in place. Long range order in this context is the presence of crystals or grains of defined size possessing angular facets or structure anomalies.

A volume of black slag material is ejected onto the surface of the substrate, as a function of the blast pressure of the gas, which is coincidentally ejected along the beam path. The ejecta is loosely adherent and can be readily removed from the surface by scraping one substrate against another. There is a grey-to-black coating on the inside surface of the hole. This coating is not removed by normal means and is resistant to mineral acids and solvents, in the same way the bulk of the material is resistant to chemical attack. The flow pattern of the material gives rise to regions of material which have been frozen and left in place.

The dark material is identifiable. Samples have been weighed and heated in a furnace to temperatures of approximately 800° C. and maintained at temperature until the entire surface has reached the desired temperature. One hour is a typical time to hold the material at peak temperature. The peak dwell time is a function of the loading and design of the furnace. Heating and cooling rates between 0.2°–1°/min are typical. The weight of the substrate is unchanged by the heat cycle. Following the heating cycle, the appearance of the ejecta and the inner surface of the hole is the same color as the surrounding material, a pale ivory. The ejecta is reasonably adherent and can be chipped off to reveal a uniform internal coloration.

Consequently, substrate 11 is annealed in air at a temperature of 800° to 1000° C. The annealing process provides a variety of advantages; 1) substrate 11 becomes clean and more uniform in composition, flatness, and mechanical properties; 2) internal stresses caused by drilling and handling are reduced; and 3) slag 23 chemically recombines with the constituents of substrate 11, thereby facilitating subsequent improved metallization. A slow, 0.2 to 1 degree/minute temperature increase from ambient temperature is suitable.

Typical annealing time is 1–4 hours at 800° C.–1000° C. with a typical choice being 1 hour at 800° C. Annealing periods as long as 8 hrs. and as short as 20 minutes may be suitable. If desired, the annealing may be performed in pure oxygen or an oxygen enriched atmosphere, generally for a shorter period of time.

Figure 2:
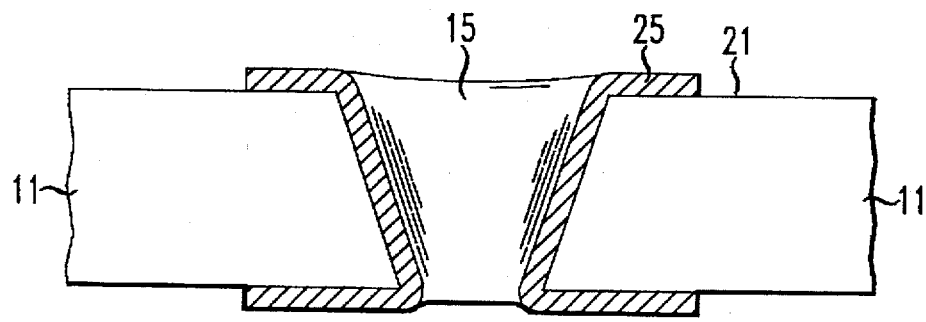

Subsequently, one or more layers of metallization (reference numeral 25, FIG. 2) may be formed upon upper and lower surfaces of substrate 11 and within hole 15. Electroless deposition or sputtering may be utilized. The following metallization schemes have been found to be feasible: (The first deposited metal being listed first).

1) Titanium-Palladium-Copper - DC Magnetron Sputtered Ti (100–240 nm), Pd (2–12 nm), Cu (100–6000 nm)

2) Titanium - Ti/Pd Alloy-Copper - DC Magnetron Sputtered Ti (100–240 nm), Alloy (4–12 nm), Cu (100–6000 nm)

3) Titanium - Copper - DC Magnetron Sputtered Ti (0–240 nm), Cu (100–6000 nm)

4) TaN - Electroless Copper TaN (0–100 nm), Cu (0–30000 nm) - Copper as needed, no upper limit 5) Titanium-Palladium-Electroless Copper Ti (10–100 nm), Pd (10–100 nm), Cu (0–30000 nm) - Copper as needed, no upper limit 6) Electroless Nickel-Electroless Copper Ni (1–250 nm), Cu (0–30000 nm) - Copper as needed, no upper limit 7) Direct Electroless Copper Cu (0–30000 nm) - Copper as needed, no upper limit The teachings on the present application are also applicable to substrates having the composition $M_xBa_yTi_mO_z$, where the M is a metal comprised of: Sn, Y, Zr, Zn or other modifier constituents such as cobalt, Nd, or other Lanthanide constituents.

The invention claimed is:

1. A method of forming a via in a substrate, wherein said substrate is barium titanate of an ivory color, comprising:

forming an opening in said substrate by exposing said substrate to an energy beam, thereby forming slag in said opening, said slag being adjacent to, but not part of, said substrate;

heating said substrate to 800° C.–1000° C., thereby causing said slag to recombine with said substrate, resulting in the ivory color; and depositing a material upon said substrate and within said opening.

2. The method of claim 1 in which said barium titanate includes an element chosen from the group consisting of cobalt, neodymium, tin, zinc, lanthanide elements, zirconium, and samarium.

3. The method of claim 1 in which said energy beam is a laser beam.

4. The method of claim 3 in which said laser beam is focused upon said substrate.

5. The method of claim 1 in which said heating step is performed for a time between 20 minutes and 8 hours.

6. The method of claim 1 in which said depositing step is performed by sputtering.

7. The method of claim 1 in which said material is metal.

8. The method of claim 7 in which said metal is chosen from the group consisting of copper, titanium, palladium, tin and nickel.

* * * * *